US012619798B2

(12) United States Patent (10) Patent No.: US 12,619,798 B2
Sharma et al. (45) Date of Patent: May 5, 2026

(54) METHOD FOR UPDATING A DESCRIPTION OF AN AUTOMATION SYSTEM

(71) Applicant: Schneider Electric Industries SAS, Rueil Malmaison (FR)

(72) Inventors: Mayank Sharma, Grenoble (FR); Soguy Mak-Karé Gueye, Grenoble (FR); Philippe Nappey, Le Sappey en Chartreuse (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 1331 days.

(21) Appl. No.: 17/373,937

(22) Filed: Jul. 13, 2021

(65) Prior Publication Data

US 2022/0019709 A1 Jan. 20, 2022

(30) Foreign Application Priority Data

Jul. 16, 2020 (EP) .................................... 20305819

(51) Int. Cl.
| | |
|---|---|
| *G06F 30/18* | (2020.01) |
| *G06F 8/30* | (2018.01) |
| *G06F 8/77* | (2018.01) |
| *G06Q 10/06* | (2023.01) |
| *G06F 8/65* | (2018.01) |

(52) U.S. Cl.
CPC ............... *G06F 30/18* (2020.01); *G06F 8/37* (2013.01); *G06F 8/77* (2013.01); *G06Q 10/06* (2013.01); *G06F 8/65* (2013.01)

(58) Field of Classification Search
CPC ... G06F 30/18; G06F 8/37; G06F 8/77; G06F 8/65; G06Q 10/06

USPC .......................................................... 703/18
See application file for complete search history.

(56) References Cited

U.S. PATENT DOCUMENTS

| | | | |
|---|---|---|---|
| 2009/0300586 A1* | 12/2009 | Bernardini | ................ G06F 8/61 717/126 |
| 2010/0110933 A1 | 5/2010 | Wilcock et al. | |
| 2011/0004565 A1* | 1/2011 | Stephenson | .......... G06Q 10/067 705/348 |

FOREIGN PATENT DOCUMENTS

WO 2009082386 A1 7/2009

OTHER PUBLICATIONS

Glinz, Martin. "On non-functional requirements." 15th IEEE international requirements engineering conference (RE 2007). IEEE, 2007. (Year: 2007).*
European Search Report and Written Opinion dated Dec. 21, 2020 for corresponding European Patent Application No. EP20305819. 3-1224, 10 pages.

(Continued)

*Primary Examiner* — John E Johansen
(74) *Attorney, Agent, or Firm* — Wolf, Greenfield & Sacks, P.C.

(57) ABSTRACT

A computer-implemented method for updating a description of an automation system of a power network including at least: providing a preliminary description of the automation system, the preliminary description including components and relationships; providing at least one non-functional requirement; adapting the preliminary description to meet the non-functional requirement by modifying the components and relationships; instantiating a final description of the automation system based on the adapted preliminary description.

17 Claims, 3 Drawing Sheets

(56)  References Cited

OTHER PUBLICATIONS

Vitharana, Padmal, et al., "A knowledge based component/service repository to enhance analysts' domain knowledge for requirements analysis", Information & Management, vol. 49, No. 1, 2012, pp. 24-35.

Henninger, Scott, "Supporting the Construction and Evolution of Component Repositories", Proceedings of the 18th International Conference on Software Engineering, IEEE, 1996, pp. 279-288.

* cited by examiner

| Component | | | | (Asset, Host, Service) | | | | |
|---|---|---|---|---|---|---|---|---|
| Attributes | Id | | | | | | | |
| | Name | | | | | | | |
| | Type | | | | | | | |
| | ... | | | | | | | |
| Interfaces | Attributes | | ... | | | | | |
| | Connections | | Attributes | | | | | |
| | | | Endpoint | Reference to the target component endpoint | | | | |
| | Endpoint | | Attributes | | | | | |
| | Resources | | Resource | Attributes | | | | |
| | | | | Read | Attributes | | | |
| | | | | Write | Attributes | | | |
| | | | Resource | | | | | |
| Operations | Start | Attributes | | | | | | |
| | Stop | Attributes | | | | | | |
| | Configure | Attributes | | | | | | |

METHOD FOR UPDATING A DESCRIPTION OF AN AUTOMATION SYSTEM

TECHNICAL FIELD

The present disclosure relates to a method for designing an automation system. More particularly, the invention relates to a method for updating a description of an automation system and a system adapted to implement such method.

BACKGROUND ART

Engineering and operation of power utility automation systems are more and more complex. Besides, end customers are increasingly asking for stringent non-functional requirements, such as performance and dependability requirements. These requirements must be considered during the whole lifecycle (specification, design, build, operation, maintenance) of the automation system.

This requires continuous validation and refinement of the automation systems that may not be easy to implement without oversimplifying their descriptions. There is therefore a need for enhanced ways of specification, designing, simulation, validation of determining expected overall capability metrices of automation systems, in particular to meet the evolving needs of a power network infrastructure.

Also, to simplify the lifecycle aspects of initial deployment of the automation system solution followed by lifecycle related system updates and upgrades, there is a need for an easy way to automatically generate/update a description of an automation system while asking a minimum number of requirements/inputs to a user.

SUMMARY OF INVENTION

It is an object of the invention to alleviate the challenges of designing, engineering and managing non-functional requirements of automation systems, and in particular, to provide designing tools for modelling in a more simplified way.

In one aspect, the invention relates to a computer implemented method for updating a description of an automation system of a power network comprising at least the steps of:

providing a preliminary description of the automation system, the preliminary description comprising components and relationships between the components;

providing at least one non-functional requirement;

adapting the preliminary description to meet the non-functional requirement by modifying the components and relationships; and instantiating a final description of the automation system based on the adapted preliminary description.

In another aspect, the invention relates to a system, such as an engineering system, for designing a description of an automation system comprising:

a description editor adapted to provide a preliminary description of an automation system, the preliminary description comprising components and relationships between the components, and at least one non-functional requirement; and an instantiation element to adapt the preliminary description to meet the non-functional requirement by modifying the components and relationships and to instantiate a final description of the automation system based on the adapted preliminary description.

This enables a description refinement/update automatically while meeting the constraints on the description asked by the user. Such refinement/update can be performed even for very complex automation system comprising a large number of components and relationships.

The disclosed technical solution is thus particularly useful to automation system engineers and domain expert of such automation systems during all the system lifecycle phases.

Overall, the invention results in more accurate simulation of the system behavior and in more reliable estimation of its overall capabilities, for instance by estimating the expected performance, availability of application functions during the design and integration phase before the deployment, in particular manual or automatic installation and commissioning, to an operational (or production) environment. It is thus possible to obtain a fully defined and autonomous description of an automation system given a specific application function or considering specific constraints. This method and system can be applied to any automation system.

In another aspect, it is proposed a computer-readable non-transient recording medium on which a software is registered to implement the method as defined here when the software is executed by a processor.

The following features can be optionally implemented, separately or in combination one with the others.

The method comprises a further step of using the instantiated description for deployment of the automation system.

A component belongs to the power network and/or the automation system and is chosen among an asset, a service and a host.

A relationship is either a physical connection between two components or a resource allocation by mapping a service to one or several hosts.

The components are provided in the preliminary description by using a meta-model, each component being defined by a specific profile.

The step of providing a preliminary description comprises obtaining attributes on the components from a user.

Adapting the preliminary description comprises modifying attributes of the components of the preliminary description.

The step of providing at least one non-functional requirement comprises obtaining attributes on the automation system capabilities from a user.

Adapting the preliminary description comprises removing components from the preliminary description.

Adapting the preliminary description comprises selecting other components from a repository to be added to the preliminary description, selection of the components being based on the preliminary description and the non-functional requirement.

The step of selecting components from the repository to be added to the preliminary description comprises the steps of:

choosing one component profile from the repository;

validating the preliminary description by verifying that the preliminary description comprising the chosen component profile meets the non-functional requirement;

if the chosen component is not validated, adjusting the preliminary description and validating again the preliminary description by repeating the previous step; and if the chosen component profile is validated, adding the chosen component profile to the preliminary description.

The step of adjusting the preliminary description can consist in choosing another component having a different profile or adding another component to the preliminary description.

The component is chosen from a repository of a profile creator, the repository comprising component profiles.

The non-functional requirement is a performance or dependency metric of the automation system.

The automation system is adapted to automate an electrical network.

The engineering further comprises a profile creator adapted to create and store components profiles from contributors.

The engineering further comprises a user interface adapted to allow a user to input information to the description editor.

Further objects, aspects, effects and details of the invention are described in the following detailed description of a number of exemplary embodiments, with reference to drawings.

DESCRIPTION OF EMBODIMENTS

Figures and the following detailed description contain, essentially, some exact elements. They can be used to enhance understanding the disclosure and, also, to define the invention if necessary.

Example methods and systems to design automation are described. In the following specification, for purposes of explanation, numerous specific details are set forth in order to provide a thorough understanding of example embodiments. It will be evident, however, to one skilled in the art that the present invention may be practiced without these specific details. As used herein, the term "or" may be construed in either an inclusive or exclusive sense.

Unless more specifically defined in the following detailed description, terminology and definitions used in the context of this invention can be terms or expressions that are well known in the art as part of the power system or computer engineering domains. More particularly, such definitions may be already available from official organizations, such as the International Electrotechnical Commission (IEC) or the Institute of Electrical and Electronics Engineers (IEEE), and can be found in specific standards, e.g. IEC 61850: 2019 (including all derivative standards) or ISO/IEC/IEEE 24765: 2017.

Figure 1:
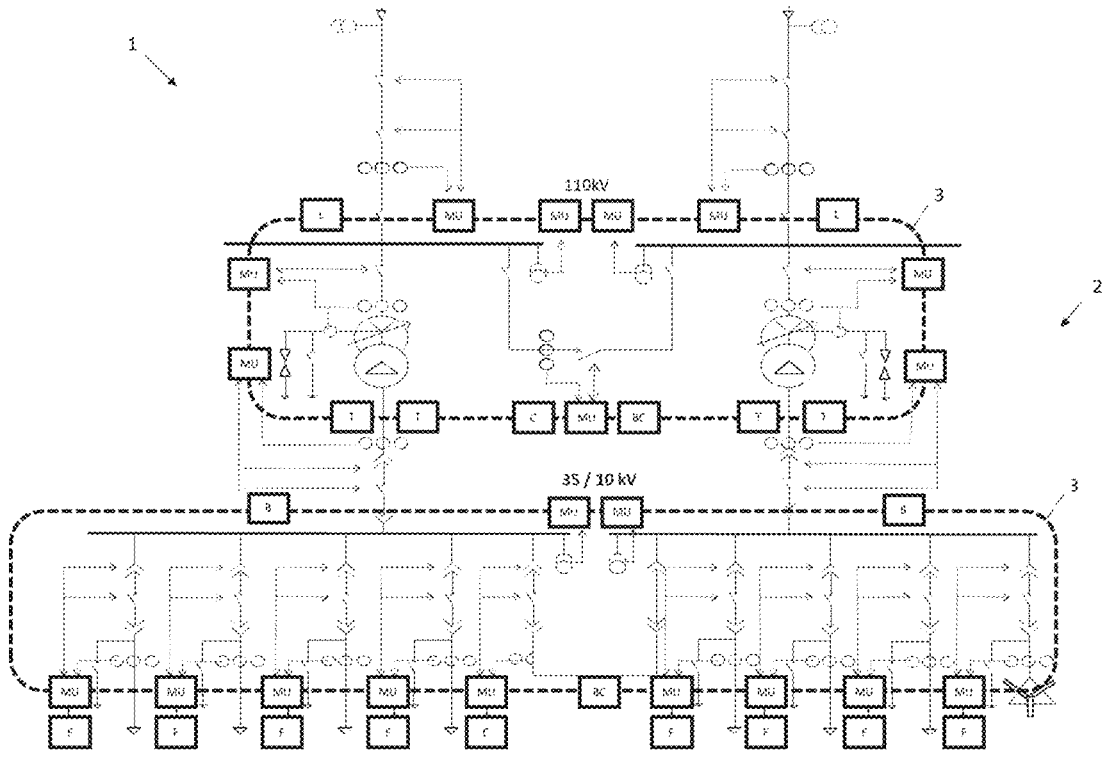
FIG. 1 is a design of an electrical utility network and of its corresponding automation devices according to an embodiment.

Referring to FIG. 1, a power utility network can comprise an electrical network 1 and an automation system 2.

The power utility network is conventionally implemented using several components. By "component", it is understood an entity, such as a hardware assembly or software module, in particular with a discrete structure considered at a particular level of analysis.

Also, a component is one of the parts that make up the power utility network. A component may be hardware or software and may be subdivided into other components. In the following description, the terms "module", "component" and "unit" may be used interchangeably or defined to be sub-elements of one another in different ways depending upon the context.

Components of the power utility network can include a plurality of assets.

Examples of assets of the electrical network 1 may be, but not limited to, circuit breakers, current and/or voltage transformers, capacitors banks, switches, reclosers, lines, or any other assets that make up the physical electrical power system that generates, transmits, and distributes power.

Referring to FIG. 1, as known to those skilled in the art, assets are merging units MU and protection devices F, transformer protection devices T, protection line device L and busbar protection devices B.

The automation system 2 provides a plurality of protection, control and automation application functions to the power utility network. Application functions are tasks which are performed in or by the automation system 2 to operate the power utility network.

In an electrical network, application functions typically aim at providing safe and reliable power delivery to end users. More specific examples include protection schemes such as circuit breaker failure with reverse circuit breaker blocking, arc protection, current, voltage and frequency protection, or the like. Other traditional application functions can include the protection, control and monitoring of a subpart of a power utility network. It includes intelligent fault location and isolation, auto-restoration systems, contingency analysis, relay protection integration and coordination, restoration of normal connectivity, etc. Application functions can also be meter reading and analysis. More generally, it can include power quality monitoring, analysis, and reporting, reliability monitoring, analysis, and reporting, or the like.

Although the embodiment of FIG. 1 refers to an automation system 2 of an electrical network 1, this example is non-limitative and by "power utility network", it can be understood any generation, transmission and distribution, networks. More generally, the invention applies to any utility network that can be involved in the delivery of energy, such as electricity, heat, gas, or the like.

Besides, the present invention can also apply to any automation system that requires modelling and updating of its description, such as but not limited to automated power production, logistics automation, industrial automation for manufacturing, quality control and material handling processes, building automation for managing plurality of building sub-systems, or home automation for controlling household appliances and features in accommodations and residential dwellings.

In addition to assets, the power utility network, and more precisely the automation system, comprises other components hereafter referred to as automation devices or hosts. Hosts may be stand alone or connected with one or several assets of the power utility network.

A host is adapted to provide computing capabilities to the automation system 2. Typically, a host may be a processor on which a program or file is installed.

A host can be a hardware component such as a programmable logic controller (PLC) or an industrial grade server (Industrial PC). A host can also be a software component such as a cloud-based service, e.g. Infrastructure as a Service (IaaS) or Platform as a Service (PaaS).

Hosts include Intelligent Electronic Devices (IEDs). IEDs are automation devices incorporating one or more processors with the capability to execute application functions as detailed above, store data locally in a memory and exchange data with other IEDs in the automation system. To this end, IEDs may comprise an internal clock. The internal clock allows fulfilling the requirements for time tagging of events or synchronized sampling. The internal clocks of different IEDs have to be synchronized for time coherent data if requested by the hosted application functions.

Example of IEDs are electronic meters, digital/numerical relays, and digital controllers.

The automation systems can be based on the International Electrotechnical Commission (IEC) 61850 series of standards to provide interoperability between all hosts of the automation system. The series of standards provide requirements for data organization through data models and their exchanges through services over the communication infrastructure. It allows interoperability between two or more hosts from the same vendor or different vendors, to exchange information and use that information.

Each host can advantageously be connected to other hosts and can participate to one or several application functions of the automation system as detailed above. Also, application functions may require independent processing of same or different information by a plurality of hosts or a sequenced flow of manipulated information from one host to the successive hosts.

To this end, hosts may be arranged in a way, wherein one host can independently process information and forwards processed information to the next hosts. As an alternative, the hosts may be arranged in a way, wherein at least two hosts independently process messages and send them to a third host, which processes the received information on a first in first served basis. Such an automation arrangement can be utilized to provide redundant protection function, such as control bays, and/or to provide reverse blocking schemes. Other arrangements are possible.

Finally, an application function of the automation system can correspond to and rely upon a set of functions or tasks performed simultaneously or successively by one or several hosts. A function of a given host can for instance be data acquisition, collected and sent to another host of the automation system, or sent from to one or several databases for use by operators, engineers, planners, and administration. Another function by a host can be value computation. A host can also allow event-driven actions following a specific event, such as commands to trip circuit breakers to move a power system back to normal operation. Another function can be communication to process or convey messages in the automation system. Other functions are possible although not described in the present disclosure.

In addition to hosts, the automation system comprises software components, hereafter called services. A service is a base functional element or a functional capability of a host which can be modelled by a sequence of primitives (or operations), as defined in the IEC standards.

A service can be deployed/mapped on hosts and corresponds to the processing logic of a function. As a consequence, one or several services can correspond to a specific instance of a function.

A service component according to the invention can be also defined as a set of services which, when implemented, represents a well-defined set of functions in the automation system and is distinguishable by a unique name.

Examples of services include operating systems, applications, library, middleware, and the like.

The automation system can then be fully described by the plurality of components (i.e. asset, host, service) linked together by relationships.

There are two types of relationships.

A relationship can correspond to a physical connection between two components by declaring a connection from one component to another. A connection indicates that the two components are adapted to communicate information one with the other.

A relationship can also correspond to a resource allocation, for instance by mapping services to one or several specified hosts.

Because each component performs separate functions, an automation system, as a whole, depends on the performance of each of the other components linked together. For instance, in a power utility network, several components may be used together at particular times in the flow to receive data from sensors and to issue control commands, such as tripping circuit breakers if they sense voltage, current, or frequency anomalies, or raise/lower voltage levels to maintain the desired level.

To model the whole automation system, it is thus necessary that each component can be modeled in a shared digital representation in terms of its operational configuration, performance, and status. Further, in the representation, each of such modeled component can be related to one or more other component to reflect the real-world relationships.

The resulting digital representation of the automation system encompassing the modeled components and their relationships is known as a description or blueprint. The description is created in a modeling tool and stored in a model repository to be used by, for example, domain experts or system architects.

Figure 2:
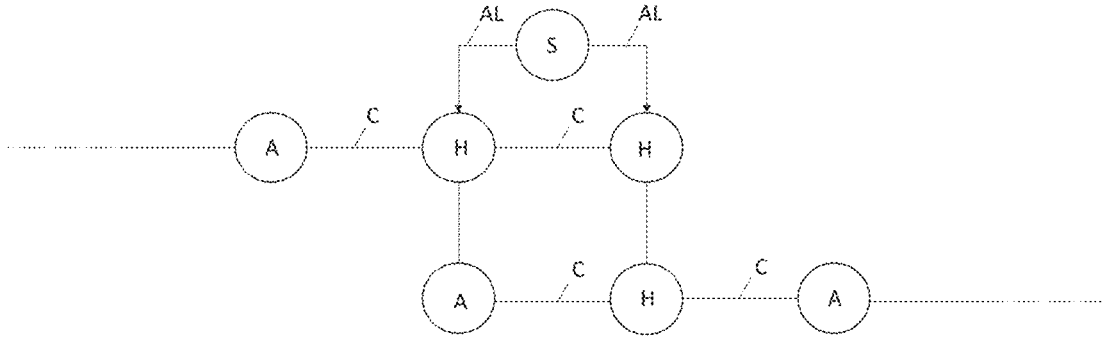
FIG. 2 shows a schematic partial view of an exemplary description of an automation system.

FIG. 2 shows a schematic partial view of an exemplary description of an automation system. In this exemplary description, assets A, host H and service S are connected with each other with relationships that are connections C or allocations AL. In this example, it is shown that a host H can be connected to several components. Also, one service S can be mapped to two hosts H.

Figures 3, 4:
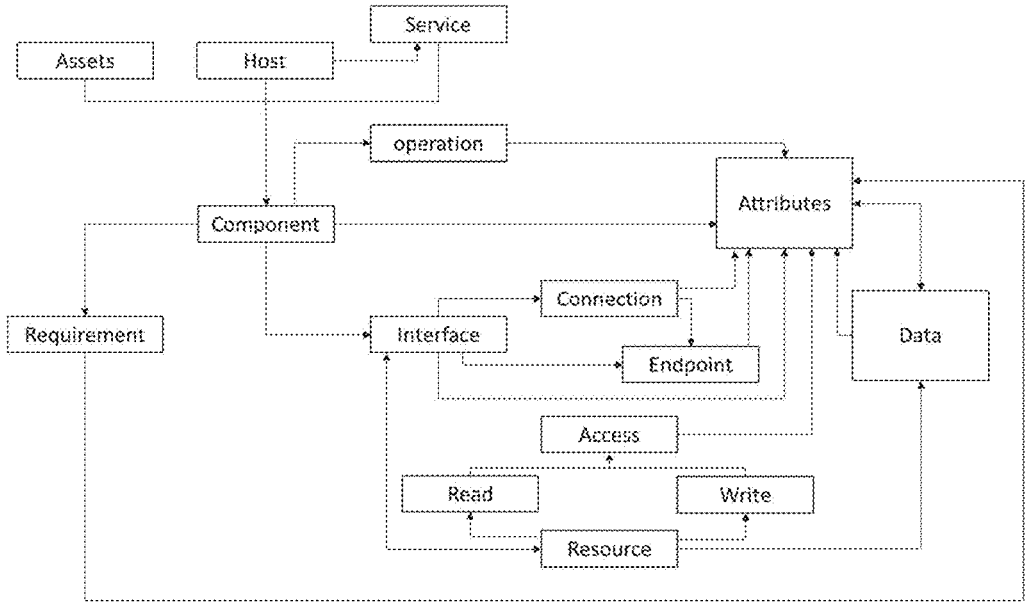
FIG. 3 is an example block diagram comprising elements engaged in the meta-modeling of a functional representation of an automation component according to an embodiment.
FIG. 4 is an example of the attributes of a component according to the present disclosure, these attributes defining a profile of the component.

FIG. 3 shows a meta-model of one component according to the invention. This meta-model is advantageously standardized for all the components of the automation system. Thus, using such a meta-model allows the management of any type of components forming the automation system.

Referring to FIG. 3, the meta-model defines sub-elements (or elements) of a component, such as interface, resource, access, endpoint, connection. Other elements are possible depending on the specific component that is considered. The meta-model also specifies the connections between these elements.

The interface is described by the endpoint when it is applicable. For instance, an interface can be either client or server. A client interface does not have an endpoint while a server interface must have one which is the entry point enabling connection to be established. The interface allows to receive or send resources to other components of the automation system. A resource corresponds to an information that is produced or consumed by the component. A resource can be accessed in a read mode, in which the resource is read by the component, and/or in a write mode, in which the resource can be generated and written.

In the context of such model-driven description, each component architecture or element can be specified in terms of attributes.

Every component has therefore different attributes to describe operations of its elements. Operations can relate to any action necessary to perform a given function of the component, such as its configuration, its performance and its status, a communication action with another component, an action of the component towards the power utility network, etc. All these attributes are necessary for the component to interact with the other components of the automation system and for executing its functions.

Also, an attribute is adapted to correspond to a property, or a parameter performed by the component or one of its sub-elements.

An attribute is commonly identified by a name and its property or parameter is described as a data. A data can be described by a type, a unit, a format and a value. The value can be a constant, provided by a user or a plugin, or can be obtained by resolving an expression. The value can also depend on the value of other attributes. It follows that an element definition can be extended by imposing data typing: a representation format, a default value, and rules are potentially involved in defining an attribute.

The meta-model and attributes may be purpose built to utilize best practice object-modeling methodologies today and to utilize new models in the future. The component's command and control, and monitoring language, syntax, context, and parameters may be modeled utilizing industry standard languages and techniques such as Extensible Markup Language (XML) or JavaScript Object Notation (JSON). More generally, it may utilize new languages, data types, communications and access techniques over time as they become available.

FIG. 4 shows a component specified by its sub-elements and attributes in a given meta-model according to an embodiment. All this information defines the component and the functions it can operate, as well as how the component can interact with other components. It can be referred to as a component profile ("profile"). It can be instantiated in the description of an automation system of which the component is a part and enables capturing the configuration of the component in a declarative way.

The component profile can correspond to a given physical component from a particular vendor. Knowing the profile of a component permits to determine how it can be integrated in the automation system comprising many more components. It can thus be used to deploy and/or configure the actual component within the automation system.

Requirement

When operating, in particular for each application function, the automation system 2 must comply with non-functional requirements. Non-functional requirements specify criteria that can be used to judge the overall operation of the automation system, such as performance, dependability or quality of service values, generally requested at the customer's end. They are contrasted with functional requirements that define specific behavior or functions.

In some embodiments, performance values are advantageously chosen among response time (latency) and/or throughput values of the automation system.

In some other embodiments, dependability values are advantageously chosen among reliability and/or availability values of the automation system.

More metrices can also be considered such as deployment objectives, technical constraints, etc. More generally, requirements include any type of constraints, rules, objectives, that describe what is expected of the properties of some components or of a part or the whole automation system.

Like other information of the meta-models of components, non-functional requirements can be expressed in the description of the automation system via attributes. Expression of requirements can be more or less complex, by using an equation formula to be solved or by relying on combinatorial optimization to find an optimal solution. Constraint programming solver, including Choco-solver, JaCop, and simulation environment tool, such as Intel CoFluent, Matlab or the like, may be necessary.

For large and complex automation systems, it becomes difficult to be able to simulate or assess the requirement metrices of the power utility system as it would require to important computation or simulation time.

To this end, the present invention aims at automatically designing/updating a description of an automation system while asking a minimum number of requirements/inputs to a user.

Engineering System

The finalized description of an automation system comprises all the necessary information to deploy such system in a real environment. According to the invention, the description comprises the components that are required for it to be operational and their relationships, as well as the non-functional requirements requested by the user.

To update the description of the automation system, a software engineering system 100, hereafter called as an engineering system, may comprise a profile creator 101, a description editor 102 and an instantiation element 103. To access the profile editor 101 and the description editor 102, the engineering system 100 may also include a user interface (human machine interface 107).

The engineering system 100 is a tool adapted to allow the user to manage different profiles of components, to introduce new profiles or requirements, and therefore to manage the description as the automation system is created or evolves. Further, it does so by automatically designing/updating through validation and refinement of the description. Also, the engineering system 100 provides operational life cycle management, dynamic resource allocation, and service level management capabilities for the description and its components.

Figure 5:
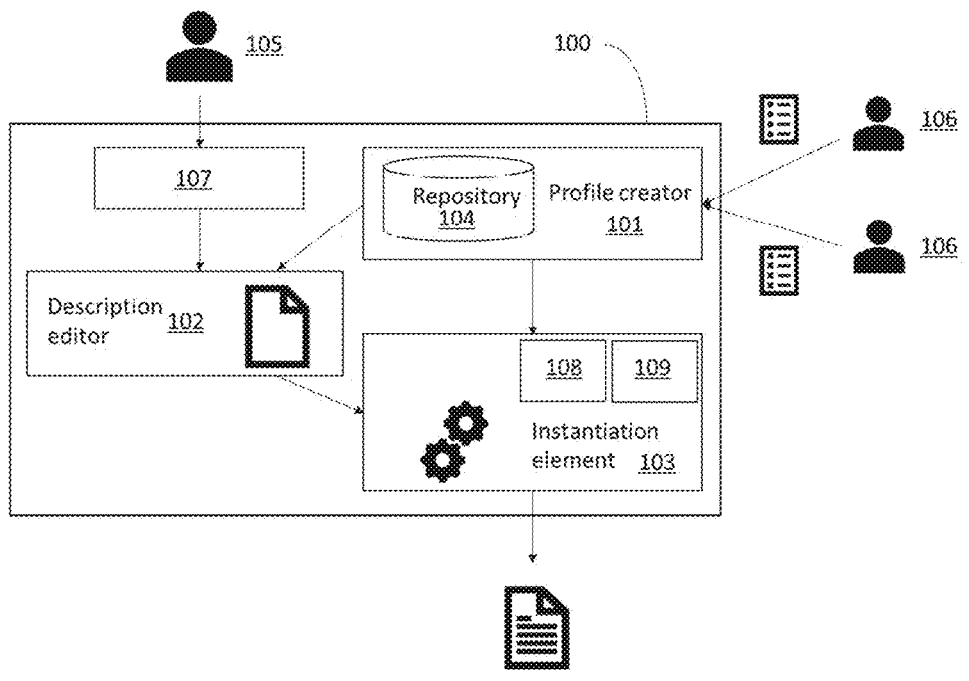
FIG. 5 is a schematic representation of an engineering system to implement the method according to the present disclosure.

Referring now to FIG. 5, a block diagram is depicted of an illustrative representation of the engineering system 100 according to various embodiments. It will be understood by those skilled in the art, however, those features are generally represented in block diagram form and, for clarity, not all features or details of such a system are shown.

The profile creator 101 receives one or more inputs from contributors 106 (e.g., domain experts) and accesses a repository 104 (e.g. from a hard disk or a remote network location). The repository 104 comprises profiles of components, for which meta-models are already existing and available.

The description creator 102 allows the user 105 to provide or define a preliminary description. In order to define such description, the user creates a template topology that defines types of components he would like to see implemented in the description and how many of each of the components to be used, as well as their relationships. The preliminary description so created is a logical description.

In the following description, the type of component should be understood as referring to a group of components, such as connector" "adaptor", "protection device", "host" etc., that may correspond to several different component profiles. For instance, the user may declare in the preliminary description that he would like to have a protection device placed at a given location of the power utility network, while not specifying which component profile should be selected precisely or from which vendor.

In the preliminary description, the user 105 may also input various information such as attributes required by the components (asset, service, host), some observability or controllability parameters, the nature of the communications, etc. The preliminary description is not a finalized description of the automation system, in that some attributes may be missing or not inputted in the description at this stage. For instance, the preliminary description may not comprise all the connections that a component has to establish. This way, less efforts is needed to the user 105 who is not required to provide all the necessary information, but only some key and necessary features/information that needs to be used in order to get the final version of the description.

The instantiation element 103 updates the preliminary description of the user 105 into a final description by taking into account the preliminary description from the description editor 102 as well as non-functional requirements also provided by the user 105. The instantiation element may include a processor 108. The processor 108 may, for example, include one or more processor cores, and may access memory 109 (e.g., random access memory, RAM, such as static and/or dynamic RAM) during execution of code to instantiate the final description. During such execution, memory 109 may store at least some of the code and data associated with the preliminary description, such as attributes relating to non-functional requirements and components.

Method Steps

Figure 6:
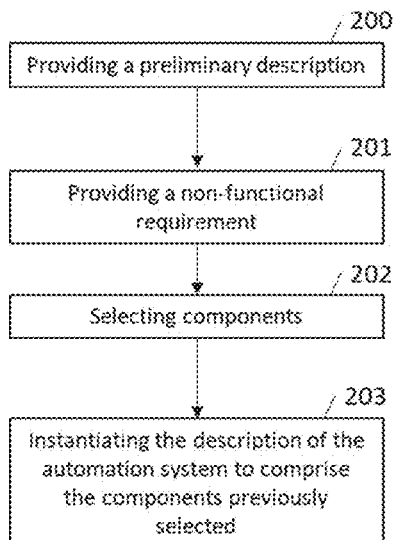
FIG. 6 is a diagram of the steps of the method according to the present disclosure.

FIG. 6 is a flow chart setting forth illustrative steps for implementing a method for updating a description according to some embodiments of the present disclosure.

In a step 200, a preliminary description of the automation system is provided by the user. According to some embodiments, the user provides the preliminary description of the automation system from the description editor.

As already explained above, providing a preliminary description can be done by inputting a set of information, i.e. selecting certain types of components, by specifying some relationships between components, by defining values of attributes.

According to an embodiment, such preliminary description may also include component profiles already fully described in the repository of the profile creator 101. At this stage, the user can for instance inspect the repository of the profile editor and choose from the available component profiles adapted to his needs. The user may also decide to create new component profiles, such newly created profiles being then saved in the repository 104.

In a step 201, at least one non-functional requirement is provided to the preliminary description by a user. As examples, such non-functional requirements can be:
   a performance requirement in which the total of consumed computational resources (CPU) by the services deployed on a given host is less than a threshold or a percentage of the total CPU capacity of said host; or
   a resource optimization value to limit the number of active hosts in the automation system.

These and other examples of non-functional requirements are given in more details in the disclosure below.

Such requirement can be expressed in any data format that is compatible with the preliminary description format, such as JavaScript Object Notation (JSON) which is an open-standard file format or data interchange format that uses human-readable text to transmit data objects consisting of attribute-value pairs.

Subsequently, the description is adapted until reaching a final description, based on the preliminary description and the non-functional requirement. Adaptation of the preliminary description can be performed by:
   modifying attributes of the components and/or relationships of the preliminary description;
   removing components from the preliminary description; and/or
   selecting other components from a repository to be added to the preliminary description, as illustrated in step 202 of FIG. 6.

Modification of attributes of a components can for instance consist in changing the attributes of one or several sub-elements of the component profile, so that this component is better suited for meeting the non-functional requirement requested by the user.

Removal of components can for instance consist in deleting one component from the preliminary description, as it appears redundant/useless or because it should be replaced by another one to meet the non-functional requirement.

Selecting other component can be performed automatically from the profile repository and connected with relationships that indicate placement and dependencies to complete the preliminary description. Selection of the components is based on the non-functional requirements and the preliminary description previously provided by the user.

While the adaptation of the preliminary description must comply with the non-functional requirements, the description, once adapted, needs to be validated against a set of validation and resolution rules.

A validation rule defines constraints that must hold on the description that contain selected components with specific profiles. An example of a simple validation rule is that the communication protocol of one component must match the communication protocol of the other components it is connected to, so that they can properly communicate. This validation rule is evaluated for every change in the description, i.e. for every selection of a component profile.

If validation rule is verified, then the instantiation element passes on to the next validation rule, until all validation rule can be verified. If the validation rule is not verified and leads to an error, then it can be determined a set of resolutions that can resolve the error to adjust the description.

Resolutions are associated with errors generated by validation rules. A resolution rule contains model transformation logic to fix the error. For example, a resolution for communication protocol incompatibility between two components may search for a different suitable component profile that still comply with the user's requirement or select one or more components to be added to the description, such as an adaptor, to be placed in between the two components. Resolution rules, once executed, change (transform) the description, this change triggers another validation cycle.

In other words, a sequence of validation and resolution rules is executed to obtain a description, which is fully resolved with no error present. If despite such sequence, error(s) are still present, a notification may be sent to the user as no final description complying with the non-functional requirement can finally be obtained.

The final description so created is a logical topology. In a step 203, when the selection of components has been made and the description has been validated and resolved, the description can be instantiated. Instantiation allows to do resource bindings as a result of which a physical description is created that specifies the concrete type of components and their specific instances.

Once the corresponding instantiation has been implemented to the automation system, the method steps can be repeated all over again from step 200 when necessary. The user can then evaluate whether another description may be more suitable by deciding of modifications that can be made as part of an optimization process.

These modifications include but are not limited to adding or deleting components from the description, changing an attribute of a component profile, changing the way one or more devices are interconnected and the like actions.

For instance, the user may decide to replace in the description one component from a vendor with another component from another vendor having similar functions but a different meta-models/profiles. As another example, the user may decide to add other components in parallel in the automation sub-design to provide redundant protection (replica) and to make sure capability requirements can be met.

Advantages

Some embodiments described herein may be used to solve one or more technical problems. For example, some embodiments may facilitate more efficient resource management and reduce the need to redeploy a system when adding few components or modifying the automation system.

Thanks to the invention, it is possible to determine capability metrices of an automation system early during system design to study performance and dependability for a specific application function. The disclosed technical solution is particularly useful to the designers of such systems when making decisions of the design of automation devices before the deployment to a production environment.

During operational phase, these metrices can also be evaluated in operational context, for instance under stress conditions (temperature, humidity, communication architecture, etc.).

If maintenance is performed on the power utility automation system later on, the method according to the present disclosure can be used to ensure that capability requirements are still met after one or several system updates and/or repairs have been made.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

First Example on Performance

In an non-limitative example, a non-functional requirement can be a resource optimization, so as to minimize the number of hosts $H_i$ (i being an integer comprised between 1 and n) in the automation system by determining the number of service $S_j$ (j being an integer comprised between 1 and m) allocated to hosts $H_i$ and therefore obtain a better performance on energy consumption. It is therefore necessary to determine an optimized service/host allocation.

Such non-functional requirement can be provided to the description by inputting the following rules, to minimize host processing (CPU) and memory (RAM) capacities:

$$CPU_{H_i} > \sum_{j=1}^{m} \left( CPU_{S_j} \right)$$

$$RAM_{H_i} > \sum_{j=1}^{m} \left( RAM_{S_j} \right)$$

$$\text{Minimize Count}(H_i)$$

Such rules can be provided in an attribute comprising a set of equations to be solved. Inputs of these equations correspond to variables to be optimized (number of hosts and of services, host processing and memory values). Such variables can be either provided by the user, for instance to specify the memory desired for the hosts, or can be obtained from the preliminary description via the attributes CPU and RAM defined in the description of the corresponding components, i.e. hosts and services.

This non-functional requirement is then computed, and the selection of components is implemented considering the attributes of the hosts defined in the preliminary description. The final description can then allocate services to hosts while complying with the non-functional requirement. Energy consumption is optimized by ensuring the allocation of services to a limited number of hosts.

Second Example on Availability

In another non-limitative example, a non-functional requirement can be an availability of a given service of the automation system. It is therefore necessary to determine the number of replicas (redundant copies) of the service to satisfy an availability threshold.

To this end, the expected availability of service $A_{exp}$ can be considered as corresponding to the availability A of the host having N replicas in the description:

$$A_{exp} = A = (1 - (1 - Ar)^N)$$

In case of failure of M replicas of the N hosts, the partial availability will still be:

$$A_{N,M} = \sum_{i=1}^{M} \left( \frac{N!}{i!\,(N-i)!} A^{N-i} (1-A)^i \right)$$

As a consequence, such non-functional requirement can be provided to the preliminary description by inputting the following rules:

$$\text{Determine } N \text{ knowing } A_{exp}, N = \frac{\log(1 - A_{exp})}{\log(1 - Ar)}$$

$$\text{Given an interval}[A_{exp,min}, A_{exp,max}],$$

$$\text{find min } M \text{ such that } A_{exp,min} \leq A_{N,M} \leq A_{exp,max}$$

The final description can then determine the total number of host replicas necessary in the description and the number of host failure M that may occur while still satisfying the expected availability.

Third Example on Transmission Delay

In another non-limitative example, a non-functional requirement can be a resource optimization, so as to minimize the delay between services that must communicate with each other. It is therefore necessary to determine an optimized allocation of services to hosts.

To this end, communication delay between two services $S_a$ and $S_b$ can be described as follows:

If the two services $S_a$, $S_b$ are allocated to the same host, DELAY=0

If the two services $S_a$, $S_b$ are allocated to two directly connected hosts (hops=1), DELAY=DT If the two services $S_a$, $S_b$ are allocated to two hosts connected via a switch (hops=2), $$DELAY = \sum_{i=1}^{2} DT_i + DForward(sw)$$

If the two services $S_a$, $S_b$ are allocated to two hosts connected via M switch (hops=N), $$DELAY = \sum_{i=1}^{N} DT_i + \sum_{j=1}^{M} DForward(sw)$$

As a consequence, such non-functional requirement can be provided to the preliminary description by inputting the following rule:

$$Min \sum DELAY(S_a, S_b)$$

The final description can then determine the allocation of the services necessary in the description so that each pair of services $S_a$, $S_b$ can communicate while minimizing communication delay.

The person skilled in the art will understand that the non-functional requirements, such as those exemplified above, can be combined with each other, the user being able to provide more than one non-functional requirement in the preliminary description.

The invention claimed is:

1. A computer-implemented method for updating a description of an automation system of a power network comprising:

providing a human machine interface configured to allow a user to define a preliminary description of the automation system and at least one non-functional requirement;

providing the preliminary description of the automation system to an engineering system, the preliminary description comprising components, attributes of the components, each attribute corresponding to a property or parameter of a respective component, and relationships between the components;

providing the at least one non-functional requirement to the engineering system;

adapting the preliminary description to meet the non-functional requirement by modifying the components and the relationships between the components in the preliminary description, by modifying the attributes of the components;

instantiating a final description of the automation system based on the adapted preliminary description; and implementing the final description on the automation system, wherein operation of the automation system is controlled according to the final description.

2. The method according to claim 1, further comprising the step of using the instantiated description for deployment of the automation system.

3. The method according to claim 1, wherein a component belongs to the power network and/or the automation system, and is chosen among an asset, a service and a host.

4. The method according to claim 3, wherein a relationship is either a physical connection between two components or a resource allocation by mapping a service to one or several hosts.

5. The method according to claim 1 wherein the components are provided in the preliminary description by using a meta-model, each component being defined by a specific profile.

6. The method according to claim 1, wherein providing at least one non-functional requirement comprises obtaining attributes on the automation system capabilities from a user.

7. The method according to claim 1, wherein adapting the preliminary description further comprises removing components from the preliminary description.

8. The method according to claim 1, wherein adapting the preliminary description further comprises selecting other components from a repository to be added to the preliminary description, selection of the components being based on the preliminary description and the non-functional requirement.

9. The method according to claim 8, wherein selecting other components from the repository to be added to the preliminary description comprises:

choosing one component profile from the repository;

validating the preliminary description by verifying that the preliminary description comprising the chosen component profile meets the non-functional requirement;

if the chosen component profile is not validated, adjusting the preliminary description and repeating the validating of the preliminary description; and if the chosen component profile is validated, adding the chosen component profile to the preliminary description.

10. The method according to claim 9, wherein adjusting the preliminary description consists in choosing another component having a different profile or adding another component profile to the preliminary description.

11. The method according to claim 9, wherein the component is chosen from a repository of a profile creator, the repository comprising component profiles.

12. The method according to claim 1, wherein the non-functional requirement is a performance or dependency metric of the automation system.

13. The method according to claim 1, wherein the automation system is adapted to monitor, protect and/or control an electrical network.

14. A non-transitory computer-readable recording medium on which a software is stored to implement the method according to claim 1 when the software is executed by a processor.

15. An engineering system for updating a description of an automation system comprising:

at least one processor; and a recording medium coupled to the at least one processor, the recording medium storing processor-executable instructions thereon that, when executed by the at least one processor, cause the engineering system to provide:

a description editor adapted to provide a preliminary description of an automation system, the preliminary description comprising components, attributes of the components, each attribute corresponding to a property or parameter of a respective component, and relationships between the components, and at least one nonfunctional requirement;

a human machine interface configured to allow a user to access and use the description editor to define the preliminary description of the automation system and the at least one non-functional requirement; and an instantiation element configured to adapt the preliminary description to meet the non-functional requirement by modifying the components and the relationships between the components in the preliminary description, by modifying the attributes of the components, and to instantiate a final description based on the adaptation of the preliminary description;

wherein the engineering system is configured to implement the final description on the automation system, and operation of the automation system is controlled according to the final description.

16. The method of claim 1, further comprising operating the automation system with the final description implemented thereon under stress conditions and evaluating a suitability of the final description under the stress conditions.

17. The engineering system of claim 15, wherein the automation system with the final description implemented thereon is operated under stress conditions, and the processor-executable instructions, when executed by the at least one processor, further cause the engineering system to evaluate a suitability of the final description under the stress conditions.

* * * * *